United States Patent [19]

Chu et al.

[11] Patent Number: 6,114,209
[45] Date of Patent: *Sep. 5, 2000

[54] METHOD OF FABRICATING SEMICONDUCTOR DEVICES WITH RAISED DOPED REGION STRUCTURES

[75] Inventors: Chih-Hsun Chu, Hsinchu; Tzu-Jin Yeh, ChungLi, both of Taiwan

[73] Assignee: Mosel Vitelic Inc., Hsinchu, Taiwan

[*] Notice: This patent is subject to a terminal disclaimer.

[21] Appl. No.: 09/045,102

[22] Filed: Mar. 19, 1998

[51] Int. Cl.⁷ .................................................. H01L 21/336
[52] U.S. Cl. ........................ 438/300; 438/299; 438/691; 438/692
[58] Field of Search ..................................... 438/299, 298, 438/300, 301, 303, 691, 692

[56] References Cited

U.S. PATENT DOCUMENTS

| | | |
|---|---|---|
| 4,784,971 | 11/1988 | Chiu et al. . |
| 4,824,796 | 4/1989 | Chiu et al. . |
| 5,106,783 | 4/1992 | Chiu et al. . |
| 5,462,888 | 10/1995 | Chiu et al. . |
| 5,827,768 | 10/1998 | Lin et al. . |
| 6,001,697 | 12/1999 | Chang et al. . |

OTHER PUBLICATIONS

Wolf, "Silicon Processing for the VLSI Era vol. 2" pp. 167–169, 1990.
Chiu et al, "Non–overlapping super self–aligned BiCMOS with 87ps low power ECL," IEEE IEDM, pp. 752, 1988.
Chiu et al "Nonoverlapping super self–aligned device structure for high–performance VLSI," IEEE Elect. Device Lett., vol. 11, No. 2, pp. 85, Feb. 1990.

Primary Examiner—John F. Niebling
Assistant Examiner—Jonathan Hack
Attorney, Agent, or Firm—W. Wayne Liauh

[57] ABSTRACT

A method of manufacturing a semiconductor device with raised source/drain. This method eliminates the problem which is often experienced when the shallow junction technique is applied, in which over-etching of the source/drain region during the contact etching and the salicide process can lead to current leakages. The improved method includes the steps of forming a buffer conductive blocks on the source/drain regions which increase the thickness of source/drain regions. A related semiconductor structure made by the method has a plurality of bi-flange shape side wall spacers by which the semiconductor structure not only elevates the doped regions, it also provides an improved capability to suppress the electric bridges between the gate electrode and source/drain regions, respectively.

11 Claims, 4 Drawing Sheets

METHOD OF FABRICATING SEMICONDUCTOR DEVICES WITH RAISED DOPED REGION STRUCTURES

FIELD OF THE INVENTION

The present invention relates to semiconductor device structures with raised doped regions, and the process of manufacturing the same. More specifically, the present invention relates to a mass-production process for making semiconductor devices with raised doped region structures, and the semiconductor circuits made therefrom. The process disclosed in the present invention is most advantageous for manufacturing shallow junction MOSFETs with raised source/drain regions so as to reduce the sub-threshold electric current, in a commercially large scale production. The process disclosed in the invention can also be applied in the mass production of other semiconductor devices such as CMOS, EPROM, logic circuits, etc., to raise the height of the doped regions thereof for forming the contact hole in conjunction with a salicide process.

BACKGROUND OF THE INVENTION

Metal-oxide semiconductor field effect transistor (MOSFET) and the various methods of manufacturing are well known in the art. For economic reasons, the dimensions of the individual device, or circuit, are to be made as small as possible, so that more circuits can be squeezed in one chip, and that more dies can be formed in a single wafer. Therefore, the trend in the semiconductor industry is to increase the dimension of the wafer while, at the same time, reduce the dimension of individual semiconductor devices.

During such a drive to miniaturization, the gate lengths of MOSFETs are increasingly made to be narrower. However, if we merely decrease the gate length but keeping all other design conditions the same, some problems will be experienced. As shown in FIG. 1A, the channel (i.e., the distance between the source and drain) will overlap with the depletion regions of source and drain; this will lead the so-called short channel effect and increase the sub-threshold current $I_d$. Both conditions can cause adverse effects are highly undesirable.

The sub-threshold current $I_d$ is defined as the current passing through the channel from drain to source when the gate voltage is smaller than the threshold voltage specific to a device. In other words, the sub-threshold current is the current which exists when the MOSFET is "Off".

The movements of carriers in a semiconductor circuit can be categorized into two modes: the drifting mode and the diffusion mode. The first mode is caused by an electrical field; whereas, the second mode is related to the temperature of the carriers. Using an N-type MOSFET as an example, the movement of the carriers is under the drifting mode when the gate voltage is greater than the threshold voltage. On the other hand, when the applied gate voltage is lower than the threshold voltage, the movement of carriers will be switched to the diffusion mode. By the nature of carrier movement, the NMOS can be considered as an equivalent of an npn Bipolar Junction Transistor (BJT) constructed having the structure of "source-channel-drain", whose PN junction between source and channel is under a forward bias and whose junction between channel and drain is under a reverse bias so that the NMOS under the condition of diffusion mode is operated as an acting mode npn BJT. And electrons will flow from source to drain. The sub-threshold current $I_d$ is the sum of all these moving electrons.

FIG. 1B shows sub-threshold current $I_d$ as a function of gate voltage under various gap width (i.e., channel length) conditions. FIG. 1B clearly shows that, as channel length decreases, the sub-threshold current $I_d$ increases. Under the operating conditions underlying the FIG. 1B test results, it can be seen that, when the channel length is less than 1 $\mu$m, the sub-threshold current will experience a rapid increase and large amounts of electrons will be drifting from the source into the channel. This situation causes the operation mode of the NMOS to approach or even become an active mode, even though the gate voltage is still substantially smaller than the threshold voltage. This means that the gate electrode has lost its ability of serving as a control switch.

The technique of high-concentration doped region substrate has been applied in an attempt to solve the above-mentioned problem by limiting the extent of the depletion region from which electrons can be diffusing into the channel. Another research direction for reducing the sub-threshold current is to minimize the cross-sectional area of the channel, based on the direct proportional relationship between the sub-threshold current $I_d$ and the cross-sectional area of the channel. This had led to a new class of diffusion techniques for manufacturing semiconductor devices called "Shallow Junction MOSFET Manufacturing" technique.

Although the application of shallow junction techniques can solve the problem of high sub-threshold current $I_d$ under the conditions of reduced channel length, some other drawbacks have, however, surfaced which mainly involve the problems associated with the contact hole forming and the salicide (self-aligned silicide) process. With the shallow junction technique, the source/drain regions are vulnerable to chemical attacks during the contact hole etching and salicide formation. For the ultra shallow junctions, the over-etching will cause a concaved bowl in the junction and allow the contact plug to be too close to the junction edge. This causes the leakage current to increase. Moreover, the shallow junction technique also always poses the risks that it may etch through the junction and thus destroy the transistor.

The most directive approach at the present time is to deposit a buffer conductive layer on the source/drain regions to increase the thickness thereof. In an article entitled "A High-Performance 0.1 $\mu$m CMOS with Elevated Salicide using Novel Si-SEG Process," by Hitoshi Wakabayashi, Toyoji Yamamoto, Toru Tatsumi, Ken'ichi Tokunaga, Kakao Tamura, Tohru Mogami, and Takemitsu Kunio, IEDM (1997), it was demonstrated that a selective epitaxial growth (SEG) process can be used to form a raised source/drain device. The SEG process employed by these authors was carried out under reaction conditions of 600~650° C., with 1~2 SCCM $Si_2H_6$ gas.

While the SEG process may offer an alternative approach to fabricate raised source/drain regions, the equipment of SEG is not a mass production equipment and that most IC fabs do not have the SEG equipment. Thus, from the above discussions, it is apparent that a raised source/drain regions MOSFET manufacturing process with a mass product capability is desired as an ultra-sub-micron semiconductor technique. Further, as the shallow junction technique is applied on the type of semiconductor devices such as CMOS, flash memory, and EEPROM, the process for raising doped regions will become in greater demand.

SUMMARY OF THE INVENTION

The primary object of the present invention is to provide a method which is capable of mass producing semiconductor devices with raised doped regions. In the preferred embodiments of the present invention improved structures are constructed which can effectively suppress the electrical bridging problem associated with drifting sub-threshold current $I_d$ through a pair of raised, or vertically extended, side-wall gate spacers erected between the gate electrode and the S/D (i.e., source/drain) regions, respectively, in a way similar to the effect of erecting a raised fence between the S/D regions and the gate electrode. The improved structures of the present invention are most advantageous in preventing electrons from jumping from a buffer polysilicon layer to reach the gate electrode. With the convention structures, a spacer may effective prevent the horizontal drifting of electrons from the buffer polysilicon layer to the gate electrode, it does not prevent jumping electrons from the buffer polysilicon layer to the gate electrode. When the separation between the buffer polysilison layer and the gate electrode gate becomes smaller, the extent of jumping electrons will become more appreciable. The vertically extended, or raised, spacers of the present invention provide an effective barrier and can effective prevent such electrons from jumping across the "fence" thus providing greatly enhanced isolation ability.

In summary, in the two preferred embodiments disclosed in the present invention, it is provided a method for forming a semiconductor device raised source/drain regions which comprises the steps of first obtaining a semiconductor substrate having a device comprising a stacked gate structure, a plurality of side-wall spacers, and source/drain regions, and then depositing a buffer polysilicon layer during the next step. Thereafter, a cape dielectric layer is deposited on the buffer polysilicon layer and a CMP technique is applied to remove portions of the cape dielectric layer until the buffer polysilicon layer on the gate structure is exposed. However, as a characterstic of CMP, the polishing rate would be higher at elevated surfaces. As a result, there will be some remaining cape dielectric layer on a portion of the buffer polysilicon layer while other potions of the buffer polysilicon layer on the gate structure are exposed. The buffer polysilicon layer is then etched using the remaining cape dielectric layer as a mask so that circuits between the source, drain and gate electrodes are exposed. Finally, the remaining cape dielectric layer is removed, the buffer polysilicon layer is defined, and salicide layers are formed. A dielectric layer such as BPSG can be deposited on substrate for passivation. From the above steps, a semiconductor device with raised source and drain is completed.

According to a preferred embodiment of the present invention, the duration of polysilicon etching can be extend to dip silicon surfaces of buffer polysilicon layer, down to the height of side-wall spacers. By forming such a bi-flange shape, the bulgy side-wall spacers can become effective isolations to separate salicide layers between gate and source/drain and suppress the electrical bridging effect.

Several advantages can be realized from the various embodiments of the process disclosed in the present invention. These include the ability to increase the thickness of the source/drain regions so that the problem of over-etching during the contact hole etching can be eliminated. In the present invention, a specific structure of MOSFET is also provided to suppress the electrical bridging effect, which can short the gate electrode and the source/drain regions and cause that device to fail. Another main advantage of the process disclosed in the present invention is that it achieves these benefits while allowing the semiconductor devices to be produced via mass production technologies.

BRIEF DESCRIPTION OF THE DRAWING

The present invention will be described in detail with reference to the drawing showing the preferred embodiment of the present invention, wherein:

FIG. 2A shows a MOSFET was formed on a silicon substrate.

FIG. 2B shows that a gate structure was formed on the substrate in the active region.

FIG. 2C shows that a buffer polysilicon layer having a thickness of 200~1000 Å and a cap dielectric layer having a thickness of 2000~2500 Å were deposited on the substrate.

FIG. 2D shows that the buffer polysilicon layer was separated into two parts.

FIG. 2E shows that the gate electrode and the buffer polysilicon layer are exposed using an oxide wet etching process was remove the cap oxide and remaining cape oxide layer.

FIG. 2F shows that a portion of the polysilicon layer on the field oxide was removed and that a plurality of poly silicon blocks are formed.

FIG. 2G shows that a dielectric layer composed of NSG or BPSG was formed covering the entire substrate as a passivation layer.

FIG. 2H shows that the cross section of the raised source/drain MOSFET after the contact formation and metallization process.

DETAILED DESCRIPTION OF THE SPECIFIC EMBODIMENTS

Embodiment 1

Figure 1A:
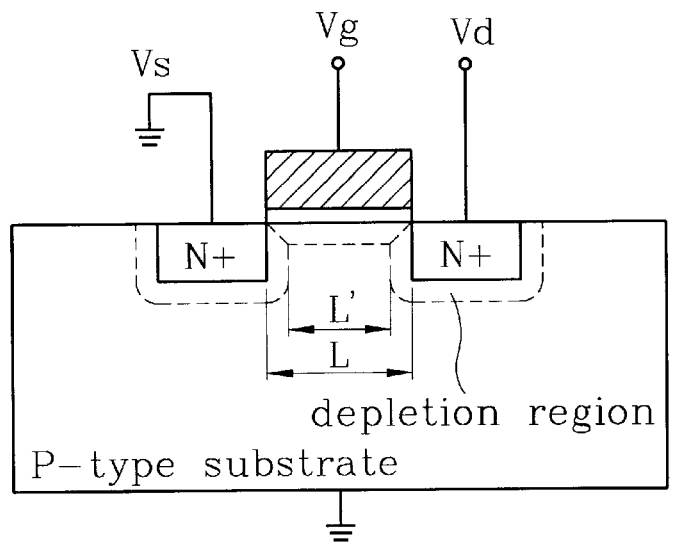
FIG. 1A shows that the channel (the distance between the source and drain) overlaps with the depletion regions of source and drain when the channel length is decreases.
Figure 1B:
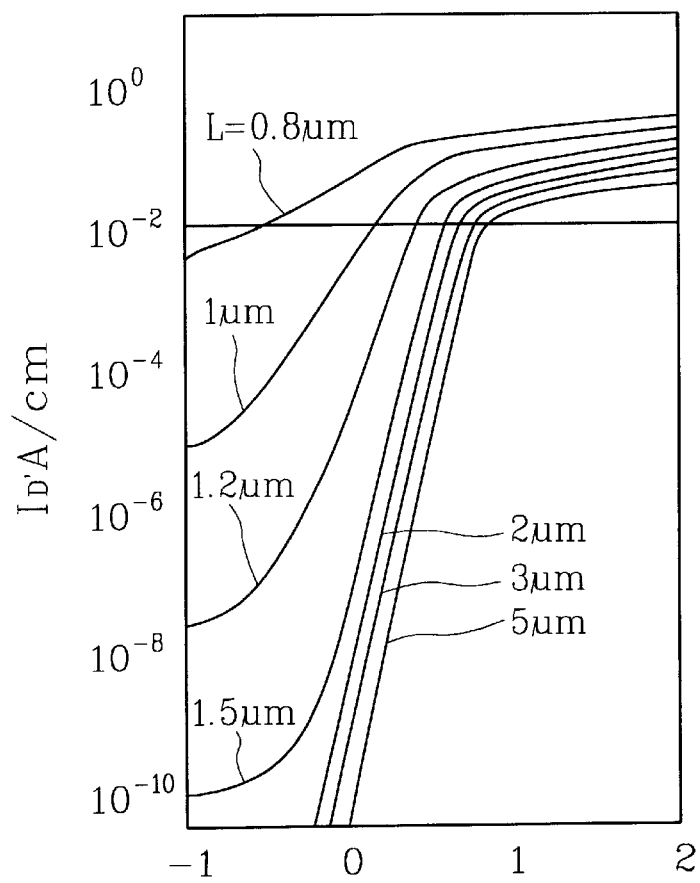
FIG. 1B shows the curves of $I_d$ as a function of gate voltage at various channel lengths.
Figure 2A:
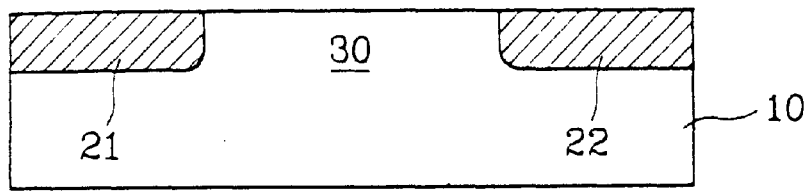
FIGS. 2A–2H are the cross-sections views of the main steps, respectively, of a first preferred embodiment of the method of the present invention for making MOSFETs with raised source/drain regions.

Referring now to FIG. 2A, which shows the MOSFET with raised source/drain regions in accordance with the present invention; it was formed on a silicon substrate 10. Relatively thick Field Oxides (FOX) 21, 22, having a thickness of about 2000~4000 Å, are formed on and in portions of the substrate surface surrounding and electrically isolating active device areas 30 using the "Local Oxidation of Silicon (LOCOS)" method or the "Shallow Trench Isolation" (STI) method. These techniques have been commonly practiced and are well-known in the semiconductor industry, and thus will not be discussed in this disclosure.

The LOCOS process includes the steps of depositing, and thermally growing, a thin pad oxide composed of silicon oxide on the substrate surface and then depositing a silicon nitride layer, usually by chemical vapor depostion (CVD) process, to serve as a barrier against thermal oxidation. The silicon nitride layer is patterned to expose the FOX regions. Then the silicon surface is subjected to an oxidizing ambient, such as steam oxidation, to form the aforementioned relatively thick field oxide regions composed of silicon dioxide surrounding the active region 30.

Figure 2B:
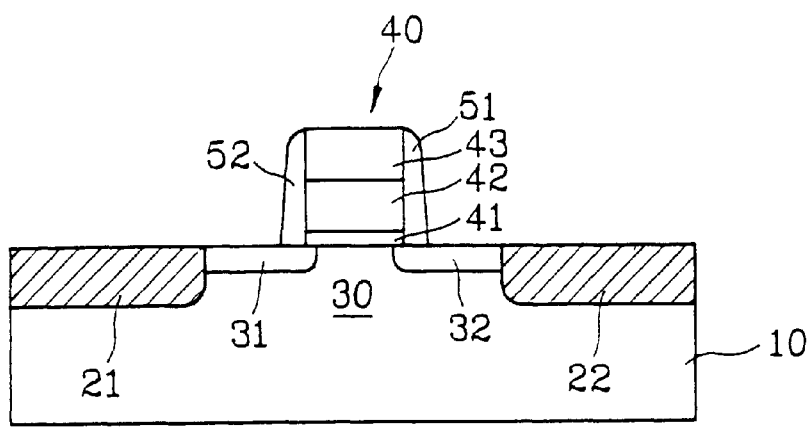

Referring now to FIG. 2B, the gate structure 40 was formed on the substrate in the active region 30. The gate structure was composed of a gate oxide 41, a gate electrode 42 and a cap oxide 43, which can be undoped CVD oxide, PSG, or BPSG. The gate structure was formed according a well-known procedure. First, a silicon oxide, which would eventually become gate oxide 41, was formed with a thickness of about 30~100 Å by thermal oxidation above the active region 30. Then, a polysilicon layer, which would eventually become gate electrode 42, having a thickness of about 1000~3000 Å was formed on the substrate by Low Pressure Chemical Vapor Deposition (LPCVD) technique. The thickness of the polysilicon layer is dependent on the particular application.

A reactive gas silane, $SiH_4$, was then introduced into the reactive chamber maintained at a temperature of about 530–650° C. This allowed a dielectric layer composed of undoped CVD oxide, PSG, or BPSG to be subsequently deposited on the polysilicon layer. The thickness of the dielectric layer, which would eventually become the cap oxide 43, was controlled to be between 1000 to 3000 Å. The gate structure was formed using an appropriate photoresist with a desired pattern, with the undeveloped photo-resist as a non-isotropic etching mask to form the gate structure 40. FIG. 2B also shows that the gate structure 40 was as a mask to form the lightly doped drain (LDD) regions 31 and 32. The LDD regions 31 and 32 were formed under the condition of "N-LDD $P_{31}$/10 Kev/3E13" or "P-LDD $B_{11}$/10Kev/ 8E12".

Subsequently, a dielectric layer (which would eventually become the side wall spacers 51 and 52), such as nitride, having a thickness of about 150~500 Å was deposited using the LPCVD technique at temperature 700~850° C. and 0.1 ~1 Torr with reaction materials of $SiH_2Cl_2$ and $NH_3$, or using a Plasma Enhanced Chemical Vapor Deposition (PECVD) technique at temperature 250~400° C. and 1~5 Torr using $SiH_4$ and $NH_3$ as reaction materials. Thereafter, a side wall spacer etching process was applied to form side wall spacers 51 and 52.

Figure 2C:
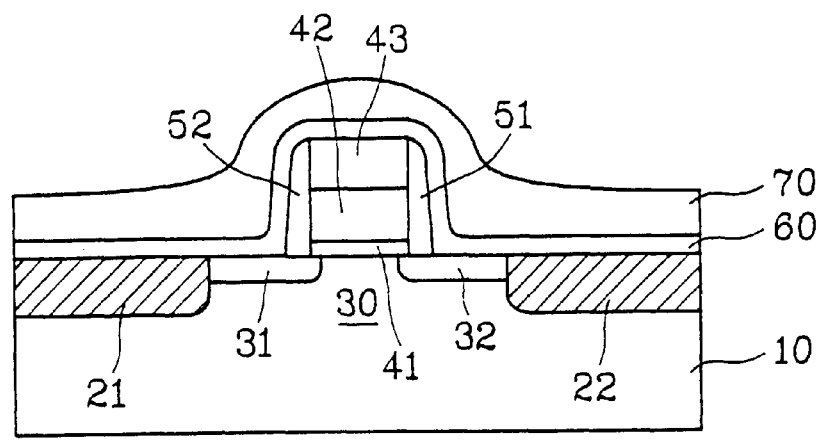

FIG. 2C shows that a buffer polysilicon layer 60 having a thickness of 200~1000 Å was deposited on the substrate 10. FIG. 2c also shows that a cape dielectric layer 70 having a thickness of 2000~2500 Å was subsequently formed on the buffer polysilicon layer 60. A flowable material such as SOG, or BPSG was preferred so as allow the cape dielectric layer 70 to have a distinct difference in its thickness between the potion above the gate structure 40 (thinner) and the portions above the source/drain regions 31 and 32 (thicker).

Figure 2D:
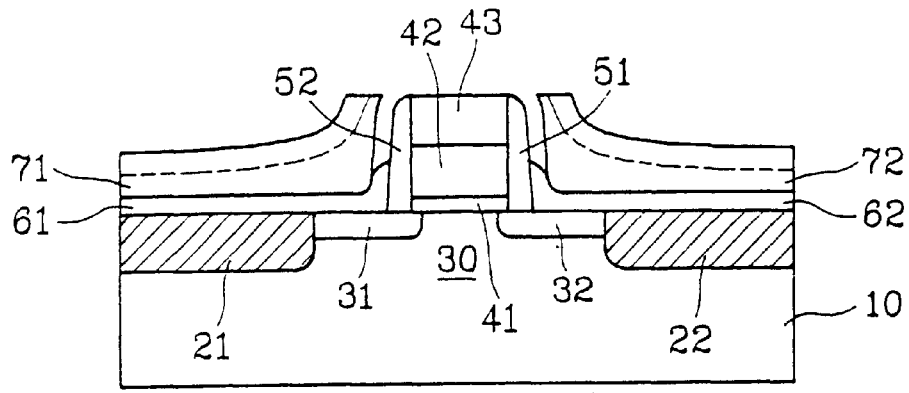

In order to disconnect source and drain regions, the buffer polysilicon layer 60 should eventually be separated. This was achieved using an Oxide CMP process which stopped at the polysilocon layer 60, an Oxide CMP and polysilicon CMP process which stopped at cap oxide layer 43, or an oxide partial etching back process which stopped on polysilicon layer 60. This was followed by an RIE (reactive ion etching) process on the buffer polysilicon layer 60 using the remaining cape oxide layer 71 and 72 as mask to remove the polysilicon adjacent to the spacer 51 and 52. At the completion of these steps, the buffer polysilicon layer 60 was separated into two parts 61 and 62, as shown in FIG. 2D.

Figure 2E:
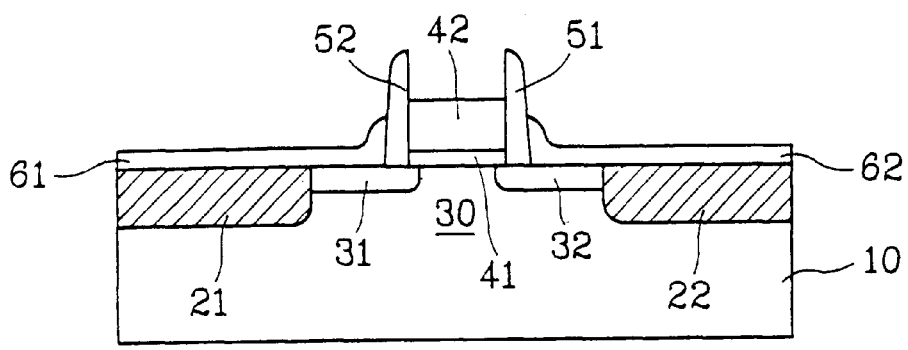
Figure 2F:
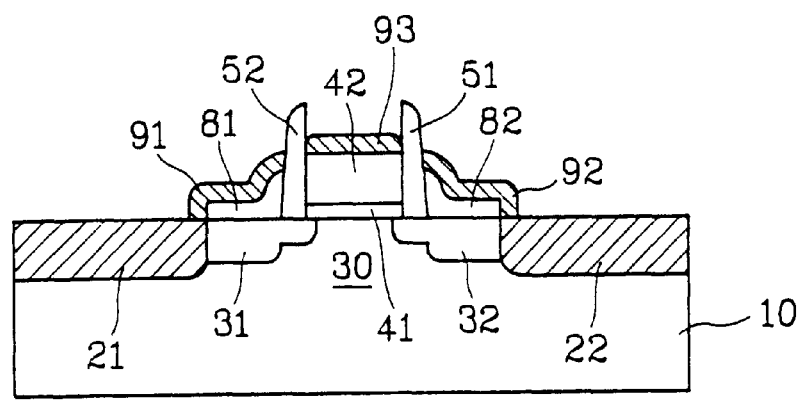

An oxide wet etching process was subsequently applied to remove the cap oxide 43 and remaining cape oxide layer 71 and 72. This caused the gate electrode 42 and the buffer polysilicon layer 61, 62 to be exposed, as shown as FIG. 2E. A photoresist layer was coated, exposed and then developed to form a polysilicon RIE mask to remove the portion of the polysilicon layer on the field oxide 21 and 22 and subsequently form a plurality of poly silicon blocks 81 and 82, as shown in FIG. 2F. Referring again to FIG. 2F, a source/drain and gate implantation process was proceeded under the condition N+ As/60Kev/3E15 or P+ BF2/20Kev/2E15. After the source/drain and gate implantation process, Titanium or Cobalt salicide was formed. The source/drain and gate implantation process consisted of the steps of: first depositing a metal layer, such as Titanium or Cobalt; applying a heating step which caused the metal layer to react with silicon and converted portion of the silicon layer into salicide; and wet etching the metal to remove the unreacted metal layer. After the above steps, salicide layers 91, 92 and 93 were formed on polysilicon blocks 81 and 82, and on gate electrode 42, respectively.

One of the key elements of the present invention is the raised, or vertically extending, pair of spacers 51 and 52. These vertically extending spacers 51 and 52 effectively stop electrons that may jump from the buffer polysilicon blocks 81 and 82 (reduced from the buffer polysilicon layers 61 and 62, respectively), which are raised structures themselves, to the gate electrode 42. Thus, the present invention allows raised dopes structures to be fabricated without incurring reduced isolation ability often experienced with prior art techniques.

Figure 2G:
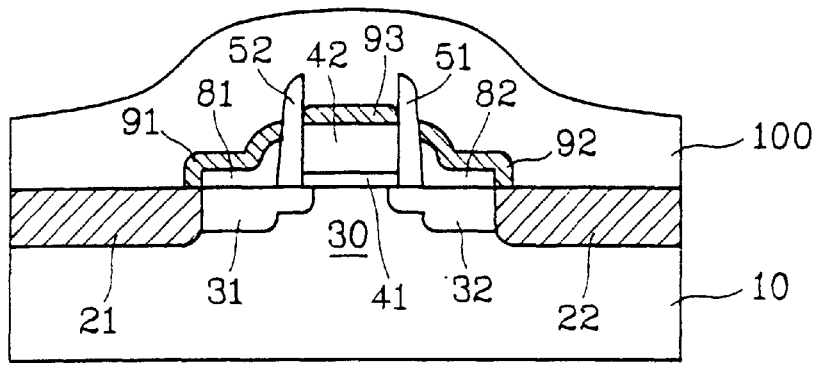
Figure 2H:
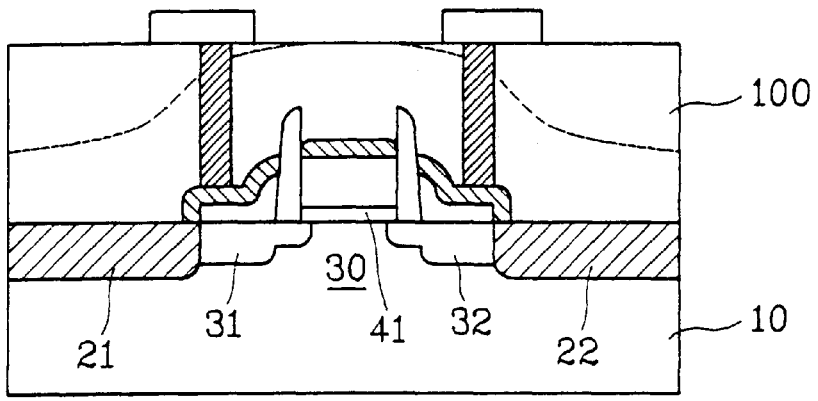

FIG. 2G shows that a dielectric layer 100 composed of NSG or BPSG was formed covering the entire substrate as a passivation layer. At this step, a MOSFET device with a raised source/drain structure was completed by above steps. FIG. 2H shows the cross section of the raised source/drain MOSFET after the Contact Formation and Metallization process.

Embodiment 2

Figure 3:
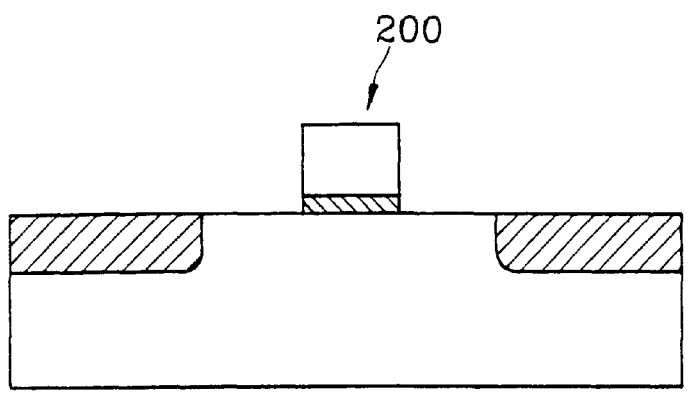
FIG. 3 shows the gate structure of embodiment 2.

The procedure in Embodiment 2 was similar to that in Embodiment 1, except that in this embodiment 2 the gate structure 200, as shown in FIG. 3, did not include a cap oxide. This gate structure in Embodiment 2 comprised a gate oxide, which can be a thermal oxide having thickness about 30~100 Å, and a gate electrode with a thickness of about 3000~5000 Å. Of course, the thickness of the gate electrode depends on the particular application. After the gate structure was formed, the subsequent steps were similar to those in Embodiment 1, which included the LDD process; formation of side-wall spacer with a nitride material; depositions of the buffer polysilicon layer and the flowable dielectric cape layer composed of SOG or BPSG, etc., Oxide CMP or Oxide Etching Back process which stop at the top of gate electrode; polysilicon etching to separate gate electrode from the source and drain with the remaining portion of the cape oxide as a mask; wet etching to remove the remaining cape oxide layer; defining the buffer polysilicon so as to allow appropriate implant in the source/drain and gate layers and form Ti or Co salicide therein; and NSG/BPSG deposition. From the above procedure, a MOSFET with raised source/drain structure was completed.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. For example, a person who is skill in art will easily infer from this invention that the sequence of the steps of buffer polysilocon definition and ion implantation can be exchanged or done prior to the step of cape dielectric layer deposition, while still achieving the same result and function. Also, the dopant drive-in procedure should not be limited in ion implantation technique. In-Situ and other diffusion processes will be able to provide the same result. Furthermore, the materials used for preparing the side wall spacer layer 50, the cape dielectric layer 70 or cap dielectric 43 only need to satisfy the requirement of providing an etching selectivity among one another. They should not be limited to what are referred in the preferred embodiments. Likewise, the buffer polysilicon layer 60 can be replaced by any other appropriate conductive material. The process and structure of salicide are used to increase the speed of the resultant semiconductor device. They can be deleted or modified from this invention. But because the main object of the present invention is to form a semiconductor device with raised doped regions, any other changed manufacture and structure should be considered as equivalents of this invention. And all such modifications and variations are within the scope of the present invention as determined by the appended claims when interpreted in accordance with the breadth to which they are fairly, legally, and equitably entitled.

What is claimed is:

1. A method of forming semiconductor circuits having raised doping region comprising the steps of:

(a) obtaining a semiconductor substrate having at least one stacked gate structure, a pair of source/drain regions, and a plurality of dielectric side-wall spacers separating said source/drain regions respectively from said gate structure, said side-wall spacers having a predetermined height;

(b) depositing a buffer conductive layer above said substrate, said buffer conductive layer being a continuous polysilicon layer in contact with both said source/drain regions and having a raised structure generally conforming to said stacked gate structure;

(c) depositing a first dielectric layer on said buffer conductive layer, said first dielectric layer being an oxide layer and having a profile generally conforming to said buffer conductive layer;

(d) removing portions of said first dielectric layer and said buffer conductive layer above said stacked gate structure using an oxide chemical-mechanical polishing (CMP) process and a polysilicon CMP process, respectively, to cause said buffer conductive layer to be separated into two regions, each region containing an exposed portion adjacent to said spacers and a covered portion under said first dielectric layer connecting to either said source or drain, respectively; and (e) applying an etching process using said first dielectric layer as mask to remove an upper part of said exposed portions of said buffer conductive layer to cause the height of said side-wall spacers to be higher relative to said buffer conductive layer, whereby said relatively higher height of said side-wall spacers prevent electrons from jumping over said spacers.

2. The method according to claim 1, after step (e), further comprising steps of applying a dielectric etching process to remove said first dielectric layer.

3. The method according to claim 2, further comprising steps of masking and removing portions of said buffer conductive layer on said isolation structures.

4. The method of claim 3, further comprising a step of applying a dopant drive-in process.

5. The method according to claim 4, further comprising a step of applying a salicide layer formation process.

6. The method of claim 1, wherein said stack gate structure comprises at least one dielectric layer and at least one gate electrode.

7. The method according to claim 6, wherein said stack gate structure further comprising a dielectric layer on said gate electrode.

8. The method of claim 1, wherein said first dielectric layer is a flowable material.

9. The method of claim 8, wherein said flowable material is SOG (Spin-On Glass).

10. The method of claim 8, wherein said flowable material is BPSG.

11. The method of claim 1 wherein said first etching process is reactive ion etching process.

* * * * *